United States Patent [19]

Shaw et al.

[11] 4,076,573
[45] Feb. 28, 1978

[54] METHOD OF MAKING PLANAR SILICON-ON-SAPPHIRE COMPOSITE

[75] Inventors: Joseph Michael Shaw, Middlesex; Karl Heinz Zaininger, Princeton, both of N.J.

[73] Assignee: RCA Corporation, New York, N.Y.

[21] Appl. No.: 755,966

[22] Filed: Dec. 30, 1976

[51] Int. Cl.² .......................................... H01L 21/205
[52] U.S. Cl. .................................. 156/613; 29/576 E; 148/175; 156/657; 156/667; 427/255
[58] Field of Search ............... 156/612, 613, 628, 644, 156/645, 654, 649, 655, 657, 662, 667; 29/571, 578, 576 E; 148/175; 427/87, 255

[56] References Cited
U.S. PATENT DOCUMENTS

| 3,661,676 | 5/1972 | Wong | 156/612 |
| 3,740,280 | 6/1973 | Ronen | 156/645 |
| 3,764,413 | 10/1973 | Kakizaki et al. | 29/571 |
| 3,766,637 | 10/1973 | Shaw et al. | 29/571 |

Primary Examiner—William A. Powell
Assistant Examiner—Jerome W. Massie
Attorney, Agent, or Firm—H. Christoffersen; R. P. Williams

[57] ABSTRACT

A method is provided for the manufacture of a semi-planar silicon-on-sapphire composite comprising a sapphire substrate, an epitaxial monocrystalline silicon mesa formed adjacent the substrate and an epitaxial deposition of monocrystalline aluminum oxide surrounding the mesa. An essential step in the method is deposition of the aluminum oxide simultaneously adjacent the sapphire substrate and the monocrystalline silicon mesa whereby aluminum oxide formed adjacent the silicon mesa is polycrystalline and aluminum oxide deposited adjacent the sapphire substrate is monocrystalline. This enables the selective removal of the polycrystalline aluminum oxide adjacent the surface of the monocrystalline silicon mesa, thereby forming the composite.

3 Claims, 4 Drawing Figures

METHOD OF MAKING PLANAR SILICON-ON-SAPPHIRE COMPOSITE

The Government has rights in this invention pursuant to Contract No. F19628-73-C-0146 awarded by the Department of the Air Force.

The present invention relates to the manufacture of semiconductor devices.

This invention is related to a method for forming a semi-planar silicon-on-sapphire composite whereby edge junctions or edge-related effects due to exposure of the sidewalls of the silicon mesa are eliminated. The invention is specifically related to a method where by the simultaneous deposition of polycrystalline alpha aluminum oxide, i.e. sapphire, and single crystalline alpha aluminum oxide adjacent surfaces of entirely monocrystalline structures the polycrystalline aluminum oxide may be selectively removed, thereby forming a novel composite useful for making microcircuits.

Specifically, the invention is useful in the manufacture of silicon-on-sapphire (SOS) devices wherein it is desirable to improve leakage current and other electrical characteristics of these devices by eliminating or diminishing diffusion into the sidewalls of the silicon mesa.

Silicon-on-sapphire substrates are usually non-planar. A typical surface configuration consists of an array of discrete single crystal silicon islands on a single crystal sapphire or alpha aluminum oxide substrate. Each silicon island or mesa presents a step of approximately 0.5 to 1.0 micrometers to an interconnecting line traversing the sidewalls of a silicon mesa. The line may be comprised of heavily doped silicon or metal. Difficulty usually arises in covering or traversing the sidewall of the silicon mesa without experiencing reduced yields and subsequent failures on extended life tests.

Sometimes several failure modes are manifested in the production of silicon-on-sapphire devices when the interface between the semiconductor mesa and the substrate and the top edge of the semiconductor mesa are permitted to be exposed to diffusion. One problem that can occur during diffusion is the erosion of the unprotected interface between the edge of the semiconductor island and the substrate. The result is the creation of discontinuities in conductive films later deposited in crossing relation to the island edge. On occasion, these discontinuities cause a type of failure whereby the discontinuities result in openings in the circuit path incorporating the particular line.

These discontinuities are also caused by the growth of gate oxide for a device at temperatures below 1000° C on a semiconductor island of silicon heavily doped with phosphorus. Under these conditions oxide growth occurs at an accelerated rate. The accelerated growth in the oxide thickness, coupled with the erosion of the sapphire substrate, causes undercutting of the edge of the silicon island. When the oxide at the interface between the edge of the silicon and the sapphire substrate is removed, a discontinuity or gap is produced. One way of having a proper deposition of a film for the line onto the semiconductor island or mesa on a substrate is to eliminate or diminish the sloping sidewall as a surface onto which deposition is made.

In particular, for silicon-on-sapphire devices a phosphorus dopant can react with the sapphire substrate. This reaction has the result of eroding the sapphire at the abutting edge of the silicon island. One method of preventing this kind of erosion and deformation of the interface between the edge of the silicon island and the substrate is to provide a protective barrier on top of the substrate and at the interface by imbedding the silicon mesa in an insulating monocrystalline substrate.

Another problem that can occur when diffusion is permitted through a window which encompasses a sidewall of the semiconductor island is the creation of an additional transistor device on the side of the semiconductor island. This additional device is electrically connected to the device formed on the top surface of the semiconductor island and is separated from the top surface by the top edge of the island. By removing each side from exposure to dopants during source and drain diffusion, this problem can be diminished or resolved and electrical operation characteristics of a silicon-on-sapphire device formed from the composite significantly improved.

More so, silicon-on-sapphire technology has been plagued primarily by three problems: the problem of the silicon island edge and its associated problems of instability; the problem of step coverage, i.e. depositing a dielectric or conductive layer onto the sidewall of the silicon mesa where it extends from the substrate to a contact on a top surface of the island, and the problem of dielectric strength weakening for the mesa sidewall coating. These problems associated with the silicon island edge or sidewall and the character of the sidewall dielectric can be solved by eliminating the sidewall or edge, but previous solutions used polycrystalline insulating material which prevented the use of low-resistivity single crystal silicon interconnections formed by epitaxy.

One method devised for eliminating diffusion into the sidewalls of the silicon mesa formed in a sapphire substrate uses selective heteroepitaxy whereby monocrystalline silicon is grown on selected portions of the sapphire substrate and elsewhere polycrystalline silicon is grown and the polycrystalline silicon used to isolate the various monocrystalline mesas formed on the substrate.

Another method for eliminating diffusion into the mesa sidewall is to selectively etch holes into the sapphire substrate and epitaxially grow monocrystalline silicon on the sapphire substrate and polish away the epitaxially grown silicon not within the holes or apertures in the substrate. One problem with this method is the extreme difficulty in providing the holes in the sapphire substrate.

The present invention solves the problem of imbedding a silicon mesa in a monocrystalline sapphire substrate using only one etching step and a single deposition step.

Figure 1:
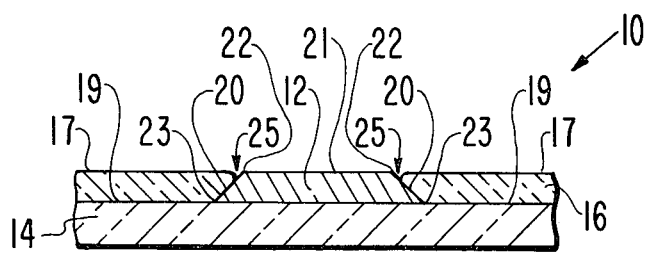
FIG. 1 depicts a cross-section of a composite of the invention.

Shown in FIG. 1 is a composite 10 comprising a monocrystalline silicon semiconductor mesa 12 epitaxially grown and attached to a substrate 14 consisting of sapphire or alpha aluminum oxide, for example, in monocrystalline form. There is also shown a layer 16 of monocrystalline alpha aluminum oxide, for example, epitaxially grown adjacent a major [1102] surface 19 of the sapphire substrate 14. The semiconductor mesa 12 has at least one sidewall 20 surrounding a top surface 21 of the mesa 12. A top edge 22 of the semiconductor mesa 12 is a juncture between the sidewall 20 and the surface 21. There is also another juncture which we refer to herein as the bottom edge 23 of the mesa 12. This bottom edge 23 is a juncture between the mesa 12 and the substrate 14. Most of the sidewall 20 of the semiconductor mesa 12 is covered by monocrystalline aluminum oxide comprising the layer 16.

The composite 10 is useful for manufacturing integrated circuits comprised of field effect transistors formed from or in the mesa 12 by diffusion of impurities for the formation of sources and drains (not shown) therein. This aspect of the utility of the invention although not a part of the invention as disclosed herein is more fully described in U.S. Pat. No. 3,766,637, issued Oct. 23, 1973 to Norris et al. and assigned to RCA Corporation, entitled "Method of Making MOS Transistors" and said patent is hereby incorporated herein by reference thereto.

Figure 2:
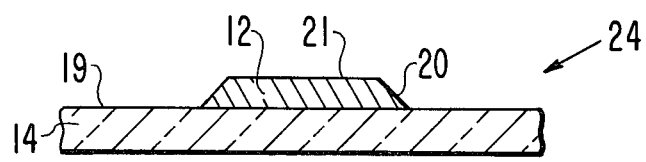
FIG. 2 is a cross-section of a composite of a silicon mesa on a sapphire substrate.
Figure 3:
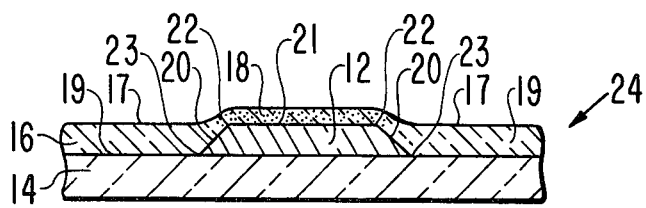
FIG. 3 is an illustration of a cross-section depicting an intermediate step in the method for making the composite of the invention.

The method of the invention may be more readily understood by reference to FIGS. 2 and 3 of the drawings wherein in FIG. 2 in particular there is first shown a composite 24 comprised of the semiconductor mesa 12 of silicon adjacent the aforementioned substrate 14 of sapphire, i.e. alpha aluminum oxide. There are many ways of forming single crystal silicon on a substrate such as alpha aluminum oxide or sapphire. One method is described briefly in U.S. Pat. No. 3,393,088, issued July 16, 1968 to Manasevit et al. and entitled, "Expitaxial Deposition of Silicon on Alpha Aluminum" and said patent is hereby incorporated herein by reference thereto. A silicon semiconductor mesa such as the mesa 12 may be subsequently formed by photolithography as known in the art.

A unique aspect of this invention is the growth of the epitaxial layer 16 adjacent surfaces 19 and 21 of the composite 24 in such a fashion that a portion 18 of the epitaxial layer 16 formed adjacent the monocrystalline silicon mesa 12 and in particular adjacent the surface 21 is polycrystalline aluminum oxide (see FIG. 3). The particular epitaxial deposition consists of alpha aluminum oxide, for example, which is deposited adjacent the surfaces 19 and 21. The portion 17 is deposited simultaneously with the portion 18 in a single deposition step. The portion 17 is deposited adjacent the surface 19 of the sapphire substrate 14 as monocrystalline aluminum oxide or sapphire.

The growth rate of the portion 17 is approximately 3½ times the growth rate of the portion 18 whereby a lesser thickness for portion 18 is achieved in comparison with the thickness of the portion 17 in the same growth period under similar growth conditions within the same growth period.

As shown in FIG. 3, the semiconductor mesa 12 of silicon has slanted sidewalls 20. The growth of the layer 16 is of such a nature that because of the accelerated growth rate of the monocrystalline aluminum oxide portion 17 and the lesser growth rate of the portion 18 growing adjacent the top surface 21, the portions 17 are found to grow or extend part-way along a portion of the sidewall 20 toward the top surface 21 of the semiconductor mesa 12 when comprised of silicon.

The portion 18 is removed from the adjacent surface 21 with hot phosphoric acid at a temperature of approximately 180° C. Typically, when the portion 18 is 0.35 micrometers thick an etching time in the phosphoric acid of approximately 3 minutes is required. After removal of the portion 18 of the composite 10, as shown in FIG. 1, is formed wherein a depression 25 is formed immediately below the top edge 22 of the mesa 12. The depression 25 does not extend all the way down the sidewall 20 of the mesa so as to expose the bottom edge 23 of said mesa 12.

Figure 4:
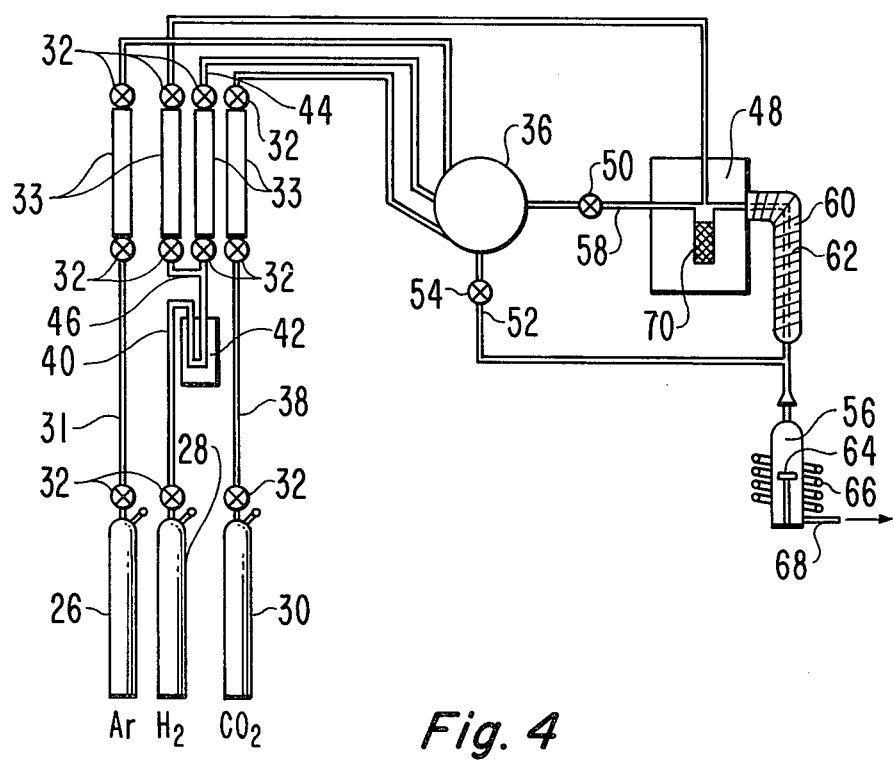
FIG. 4 shows apparatus necessary for particular steps in the method of the invention.

In FIG. 4 is shown a schematic drawing of an apparatus for carrying out the simultaneous deposition of polycrystalline and monocrystalline alpha aluminum oxide as shown in FIG. 3 for the layer 16.

The apparatus comprises three gas tanks 26, 28, and 30 containing argon, hydrogen and carbon dioxide, respectively. The argon tank 26 has a line 31 connected to a valve 32 and leading through a flowmeter 33 and another valve 32 to a mixing chamber 36. The carbon dioxide tank 30 also has a line 38 connecting other valves 32 leading through another flowmeter 33 and valve 32 directly to the chamber 36. The hydrogen tank 28 is connected via a valve 32 to a line 40 leading through a cold trap 42 and then into a branch line 44 comprising a flowmeter 33 and valve 32 and leading to the mixing chamber 36 and another branch line 46 comprising another flowmeter 33 and valve 32 and leading to a means 48 for sublimating aluminum chloride. A line 52 leads from mixing chamber 36 through a valve 54 to a quartz reaction tube 56. A line 58, containing a valve 50, connects the mixing chamber 36 and a sublimator 48. At the exit side of the sublimator 48 is a pipeline 60 surrounded by a heater 62. The pipeline 60 also leads to the reaction tube 56.

Inside the reaction tube 56 is a pedestal or susceptor 64. Outside the reaction tube 56 is a conventional radio frequency heater coil 66 connected to a radio frequency generator (not shown). Leading from the reaction tube 56 is a vent 68.

In carrying out the improved method of depositing aluminum oxide, the composite 24 which is at the manufacturing stage shown in FIG. 2, is placed on the pedestal of the susceptor 64 and inserted in the reaction tube 56.

The system is then flushed with argon from tank 26 for several minutes. The argon passes through line 34 to the mixing chamber 36 from which it proceeds through line 58 to the sublimator 48 and thence through the line 60 to the reaction tube 56. It also proceeds from the mixing chamber 36 through the line 52.

The composite 24 is heated by the radio frequency heater coil 66. The heating temperature may be varied within a range of about 875° C and 990° C, inclusive. With argon gas still flowing, hydrogen is permitted to flow from tank 28. The substrate temperature being between 875° and 990° C is critical to the simultaneous formation of polycrystalline alpha aluminum oxide adjacent single crystal silicon and the formation of monocrystalline aluminum oxide on the sapphire substrate 16. The hydrogen flow is adjusted to about 2700 cc./min. and the temperature is permitted to stabilize for five to ten minutes. When the hydrogen flow is established, the argon flow is shut off.

Meanwhile, aluminum trichloride in solid form is placed within a flask 70 within the sublimator 48 prior to deposition and the flask 70 is heated at a temperature high enough to obtain a sufficient partial pressure of the aluminum trichloride. Aluminum trichloride has a vapor pressure of approximately 10 millimeters at a temperature of about 125° C. Hydrogen flowing through the line 46 to the sublimator 48 picks up the aluminum trichloride vapor and carries it through the heated tube 60 into the reaction tube 56. The tube 60 is heated so that aluminum trichloride does not condense on its walls before reaching the reaction tube. The hydrogen, laden with aluminum trichloride vapor is adjusted to a flow rate of about 350 cc./min. for the line 46. The carbon dioxide ($CO_2$) flow is established through the line 38 to the mixing chamber 36. Hydrogen also flows through the line 44 to the chamber 36 at a similar rate where it is mixed with the carbon dioxide ($CO_2$).

The carbon dioxide flows through the line 38 to the mixing chamber 36 and is adjusted to a flow rate of about 20 cc./min. The chemical reaction which occurs is as follows:

$$2 AlCl_3 + 3H_2 + 3CO_2 \rightarrow Al_2O_3 + 6HCl + 3CO$$

The hydrogen and carbon dioxide react to form carbon monoxide and water, which is an intermediate product. The water immediately reacts with the aluminum trichloride to form alpha aluminum oxide and hydrogen chloride.

It has been found that there is an incubation period of about 30 seconds before an alpha aluminum oxide film begins to deposit on the composite 24 as shown in FIG. 3. After about 5 to 6 minutes, an interference color produced by the growing film becomes visible. A "straw" color indicates a thickness of 400 Angstroms. The film may have any thickness up to about 4000 Angstroms. A growth rate of 50 to 100 Angstroms per minute is preferably maintained, but this can be more widely varied between about 50 and 400 Angstroms per minute. However, it has been shown that the lower growth rate of about 50 Angstroms per minute produces monocrystalline alpha aluminum oxide which is most uniform and defect-free.

When the desired thickness of the layer 17 has been obtained, typically, between 0.5 and 1.0 micrometers, the deposition is terminated by simultaneously shutting off the aluminum trichloride-hydrogen carrier flow and the carbon dioxide flow.

The radio frequency power is turned off and the wafer is allowed to cool to room temperature, 28° C, for example. Argon gas is then substituted for hydrogen and the wafer is removed from the reaction tube 56 for further processing. The gas line 52 may be used to assist flushing operations.

Further processing includes removal of the portion 18 of the deposited layer 16 by immersion or etching in phosphoric acid at a temperature of 180° C for about 3 minutes, for example.

Using the method described above and the composite shown in FIG. 1, improved silicon-on-sapphire mesa transistors with lower leakage current and highly stabilized current voltage characteristics may be produced. In addition, problems associated with erosion at the bottom edge 23 between the silicon island 12 and the substrate 14 are eliminated by covering this interface with a layer of monocrystalline aluminum oxide.

We claim:

1. A method for making a planar composite of at least one silicon island imbedded in single crystal aluminum oxide comprising the steps of:
    growing monocrystalline aluminum oxide adjacent an exposed surface of a substrate of sapphire and simultaneously growing polycrystalline aluminum oxide adjacent an exposed surface of an epitaxial island of silicon deposited on said substrate, by the pyrohydrolysis of aluminum trichloride, hydrogen, and carbon dioxide at a temperature between 875° C and 990° C, and
    selectively removing said polycrystalline aluminum oxide whereby a major surface of said island is exposed and said island remains surrounded by said monocrystalline aluminum oxide.

2. A method according to claim 1 wherein the aluminum oxide depositions occur at a rate between 50 Angstroms and 400 Angstroms per minute.

3. A method according to claim 1, wherein the polycrystalline aluminum oxide is removed by etching in hot phosphoric acid ($H_3PO_4$) at a temperature of approximately 180° C.

* * * * *